(12) United States Patent
Park et al.

(10) Patent No.: US 11,956,985 B2
(45) Date of Patent: Apr. 9, 2024

(54) DISPLAY DEVICE INCLUDING BONDING MEMBER

(71) Applicant: Samsung Display Co., LTD., Yongin-si (KR)

(72) Inventors: Jun Su Park, Seoul (KR); Gi Suk Kwon, Cheonan-si (KR); O Jun Kwon, Hwaseong-si (KR); Young Gil Park, Asan-si (KR); Na Ri Ahn, Seongnam-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 468 days.

(21) Appl. No.: 17/141,286

(22) Filed: Jan. 5, 2021

(65) Prior Publication Data

US 2021/0257583 A1    Aug. 19, 2021

(30) Foreign Application Priority Data

Feb. 14, 2020 (KR) .......................... 10-2020-0018502
Aug. 10, 2020 (KR) .......................... 10-2020-0099969

(51) Int. Cl.
| | | |
|---|---|---|
| *H10K 50/84* | (2023.01) | |
| *H10K 50/86* | (2023.01) | |
| *H10K 50/87* | (2023.01) | |
| *H10K 59/12* | (2023.01) | |
| *H10K 102/00* | (2023.01) | |

(52) U.S. Cl.
CPC ............. *H10K 50/84* (2023.02); *H10K 50/86* (2023.02); *H10K 50/87* (2023.02); *H10K 59/12* (2023.02); *H10K 2102/311* (2023.02)

(58) Field of Classification Search
CPC ........ H10K 50/84; H10K 50/86; H10K 50/87; H10K 59/12; H10K 2102/311; H10K 77/111; G02F 2202/28; G02F 1/133331; G06F 1/1652; G09F 9/301; H05K 7/20954

See application file for complete search history.

(56) References Cited

U.S. PATENT DOCUMENTS 11,588,004 B2 *   2/2023   Jeong .................... H10K 59/40
2015/0266272 A1   9/2015   Lee et al.
(Continued)

FOREIGN PATENT DOCUMENTS

EP           3699727 A1      8/2020
KR      1020170084402 A      7/2017
(Continued)

OTHER PUBLICATIONS

European Search Report for European Patent Application No. 21156233.5 dated Jun. 22, 2021.

*Primary Examiner* — Kevin Quarterman
(74) *Attorney, Agent, or Firm* — CANTOR COLBURN LLP

(57) ABSTRACT

A display device includes a display panel, a polarization member facing the display panel, a cover window including an inorganic material and facing the display panel with the polarization member therebetween, and a window bonding member which is between the cover window and the polarization member attaches the cover window to the polarization member. The window bonding member which attaches the cover window to the polarization member has a modulus of about of 1 MPa to about 10 MPa.

20 Claims, 15 Drawing Sheets

(56) References Cited

U.S. PATENT DOCUMENTS

2019/0273212 A1 9/2019 Shin et al.
2020/0266368 A1* 8/2020 Park .................... H10K 77/111

FOREIGN PATENT DOCUMENTS

| KR | 1020170097856 A | 8/2017 |
| KR | 1020180033016 A | 4/2018 |
| KR | 1020180085399 A | 7/2018 |
| KR | 1020180096449 A | 8/2018 |
| KR | 1020200101574 A | 8/2020 |
| WO | 2019/074932 A1 | 4/2019 |

* cited by examiner

DISPLAY DEVICE INCLUDING BONDING MEMBER

This application claims priority to Korean Patent Application No. 10-2020-0018502 filed on Feb. 14, 2020 and Korean Patent Application No. 10-2020-0099969 filed on Aug. 10, 2020, and all the benefits accruing therefrom under 35 U.S.C. 119, the contents of which in its entirety are herein incorporated by reference.

BACKGROUND

1. Field

The disclosure relates to a display device including a bonding member.

2. Description of the Related Art

Electronic devices providing images to users, such as a smartphone, a tablet personal computer ("PC"), a digital camera, a laptop computer, a navigation device and a smart television, include a display device for displaying an image.

A foldable display device has attracted much attention. Since the foldable display device has a wide screen with good portability, there are advantages of both a smartphone and a tablet PC.

SUMMARY

Embodiments of the invention provide a display device including a bonding member which prevents defective film removal even when folding operations of the display device are repeatedly performed.

However, features of the present disclosure are not restricted to the ones set forth herein. The above and other features of the present disclosure will become more apparent to one of ordinary skill in the art to which the present disclosure pertains by referencing the detailed description of the present disclosure given below.

According to an embodiment, a display device includes a display panel a polarization member facing the display panel, a cover window including an inorganic material and facing the display panel with the polarization member therebetween, and a window bonding member which is between the cover window and the polarization member attaches the cover window to the polarization member. The window bonding member which attaches the cover window to the polarization member has a modulus of about 1 megapascal (MPa) to about 10 MPa.

According to an embodiment, a display device includes a display panel, a polarization member facing the display panel, a cover window and including glass or quartz and facing the display panel with the polarization member therebetween, and a window bonding member which is between the cover window and the polarization member and attaches the cover window to the polarization member. The window bonding member which attaches the cover window to the polarization member has both a thickness of about 300 micrometers (μm) or less, and a modulus of about 1 MPa to about 10 MPa. The modulus of the window bonding member is a measured value of indenter-measurement of the window bonding member which has the thickness of about 300 μm.

In one or more embodiment of the display device according to an embodiment, by controlling the actual modulus of a respective bonding member using indenter-measurement, adhesive properties such as restoration force and reduction or prevention of defective film removal according to the position of the bonding members included in the display device, may be managed.

The effects of the present disclosure are not limited to the aforementioned effects, and various other effects are included in the present specification.

BRIEF DESCRIPTION OF THE DRAWINGS

The above and other features of the present disclosure will become more apparent by describing in detail embodiments thereof with reference to the attached drawings, in which.

DETAILED DESCRIPTION

Figure 1:
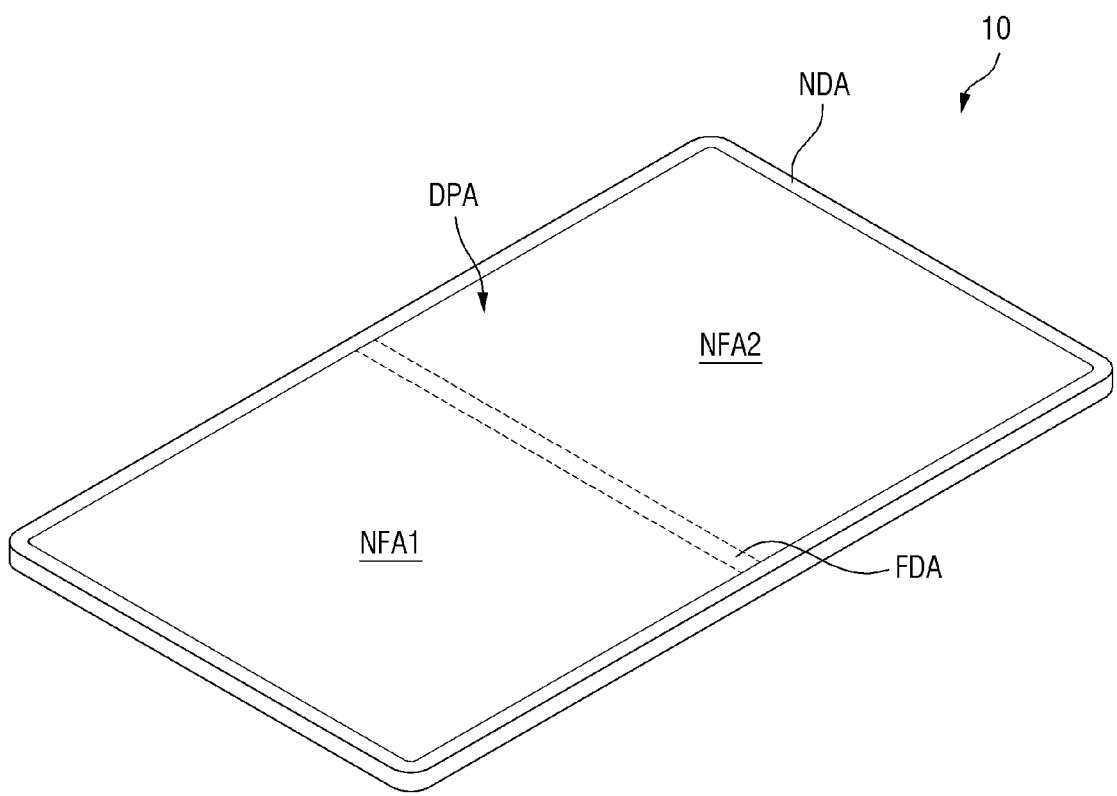
FIG. 1 is a perspective view of an embodiment of a display device.

Specific structural and functional descriptions of embodiments of the invention disclosed herein are only for illustrative purposes of the embodiments of the invention. The invention may be embodied in many different forms without departing from the spirit and significant characteristics of the invention. Therefore, the embodiments of the invention are disclosed only for illustrative purposes and should not be construed as limiting the invention. That is, the invention is only defined by the scope of the claims.

It will be understood that when an element is referred to as being related to another element such as being "coupled" or "connected" to another element, it can be directly coupled or connected to the other element or intervening elements may be present therebetween. In contrast, it should be understood that when an element is referred to as being related to another element such as being "directly coupled" or "directly connected" to another element, there are no intervening elements present. Other expressions that explain the relationship between elements, such as "between," "directly between," "adjacent to," or "directly adjacent to," should be construed in the same way.

Throughout the specification, the same reference numerals will refer to the same or like parts.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a," "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

A folding operation of a foldable display device may apply stress to one or more layer of the foldable display device. When an adhesive material layer involved in bonding of layers to each other is exposed to the stress, a defect of film removal may occur.

Hereinafter, embodiments of the invention will be described with reference to the attached drawings.

Figure 2:
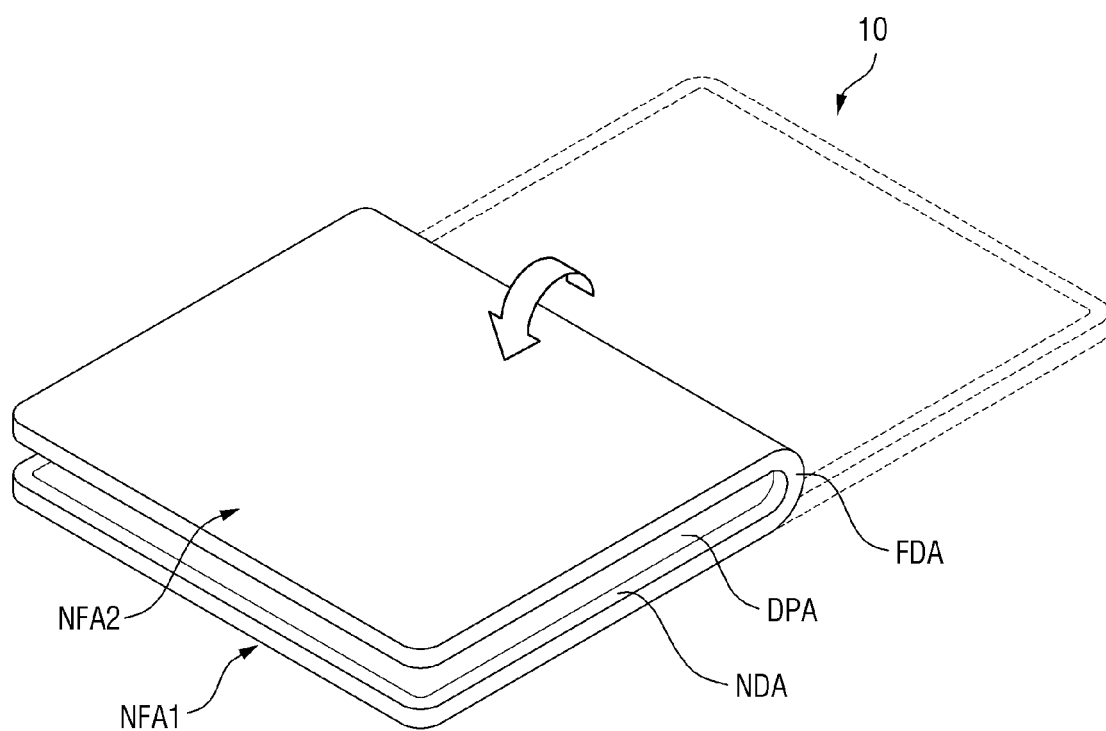
FIG. 2 is a perspective view showing an embodiment of the display device of FIG. 1 which is folded.

FIG. 1 is a perspective view of an embodiment of a display device 10. FIG. 2 is a perspective view showing the display device 10 of FIG. 1 which is folded.

Referring to FIGS. 1 and 2, a display device 10 displays an image through a display portion DPA (e.g., display area). Various devices, components, etc. for generating and/or displaying the image may be included in the display portion DPA. Examples of the display device 10 may include, but are not limited to, a smartphone, a mobile phone, a tablet personal computer ("PC"), a personal digital assistant ("PDA"), a portable multimedia player ("PMP"), a television, a game machine, a wristwatch-type electronic device, a head-mounted display, a monitor of a personal computer, a laptop computer, a car navigation system, a car's dashboard, a digital camera, a camcorder, an external billboard, an electronic billboard, various medical devices, various inspection devices, various household appliances such as a refrigerator and a washing machine including the display portion DPA, an Internet-of-Things device, and the like. A typical example of a foldable display device to be described later may be a foldable smartphone, tablet PC or laptop computer, but is not limited thereto.

Referring to FIG. 1, the display device 10 which is flat or unfolded, may be disposed in a plane defined by a first direction and a second direction which cross each other. A thickness direction may be defined along a third direction crossing each of the first direction and the second direction. A plan view of the display device 10 may be taken along the third direction, such as in a normal direction to the plane defined by the first direction and the second direction which cross each other.

The display device 10 may have a substantially rectangular shape in a plan view. The display device 10 may have a rectangular shape with right-angled or rounded corners in the plan view. The display device 10 may include four sides or edges. The display device 10 may include long sides and short sides.

The display device 10 may include one surface (e.g., an upper surface) and the other surface (e.g., a lower surface) which is opposite to the upper surface. At least one of the upper surface and the lower surface of the display device 10 may be a display surface at which an image is displayed. In an embodiment, the display surface may be located at the upper surface of the display device 10 and image display may not be performed on the lower surface. Hereinafter, such an embodiment will be mainly described, but the display device 10 may be a double-sided display device in which image display is performed on both of the upper surface and the lower surface.

The display device 10 may be divided into a display portion DPA at which an image or video is displayed and a non-display portion NDA (e.g., non-display area) adjacent to the display portion DPA, in the plan view. An image or video may not be displayed at the non-display portion NDA.

The display portion DPA may include a plurality of pixels. The pixel is a basic unit for generating and/or displaying an image or video. The pixels may include, but are not limited to, a red pixel, a green pixel and a blue pixel. The pixels may further include a white pixel. The plurality of pixels may be alternately arranged in the plan view. In an embodiment, for example, the pixels may be arranged in a matrix within the display portion DPA, but are not limited thereto.

The non-display portion NDA may be disposed adjacent to the display portion DPA. In an embodiment, the non-display portion NDA may surround the display portion DPA in the plan view. In an embodiment, the display portion DPA may be provided or formed in a rectangular shape having four sides, and the non-display portion NDA may be disposed adjacent to each of four sides of the display portion DPA, but is not limited thereto. A black matrix may be disposed in the non-display portion NDA to reduce or effectively prevent light emitted from adjacent pixels from leaking out or between the pixels.

The display device 10 may be a foldable device. As used herein, the term "foldable device" refers to a device which is foldable and unfoldable. Further, the folding may typically include folding at an angle of about 180 degrees, however, is not limited thereto. In an embodiment, the folding may include a folding angle which exceeds about 180 degrees or is less than about 180 degrees, for example, the folding angle which is equal to or greater than about 90 degrees and less than about 180 degrees, or the folding angle which is equal to or greater than about 120 degrees and less than about 180 degrees. In addition, the display device 10 may be considered folded if the display device 10 which is unfolded is subsequently folded, even if complete folding is not performed. In an embodiment, for example, even if the display device 10 is folded at an angle of about 90 degrees or less, as long as the maximum folding angle of the display device 10 becomes 90 degrees or more, the display device 10 may be considered as folded to distinguish the display device 10 which is unfolded.

The display device 10 which is folded defines a radius of curvature of the display device 10. In an embodiment, the radius of curvature may be about 5 millimeters (mm) or less, such as in a range of about 1 millimeter (mm) to about 2 mm, or about 1.5 mm, but is not limited thereto.

The display device 10 may be foldable at a folding area FDA. The folding area FDA may include a folding axis about which the display device 10 and various layers or components thereof are foldable. The folding area FDA may have a straight linear shape extending along one direction in the plan view. Although the drawing illustrates the folding area FDA extends parallel to the short side of the display device 10, the present disclosure is not limited thereto. The folding area FDA may be extended parallel to the long side or may be inclined with respect to the short side and the long side. The folding axis may have the same shape, extension, etc. as described above for the folding area FDA.

In an embodiment, the folding area FDA of the display device 10 may be determined at a specific location along the display device 10. One, two or more of the folding area FDA may be determined at a specific location(s) along the display device 10. In another embodiment, the location of the folding area FDA may not be specified in the display device 10 and may be freely set in various areas.

The display device 10 may be divided into a first non-folding area NFA1 and a second non-folding area NFA2 with respect to the folding area FDA. The first non-folding area NFA1 may be located on one side of the folding area FDA, and the second non-folding area NFA2 may be located on the other side of the folding area FDA which is opposite to the one side. When the folding area FDA is determined at a specific location, the first non-folding area NFA1 and the second non-folding area NFA2 may be specified as a planar area at which the display device 10 and/or layers thereof are not foldable or which remain flat even when the display device 10 is folded with respect to the folding area FDA.

The first non-folding area NFA1 and second non-folding area NFA2 may have a dimension or size, such as a width, a length, a planar area, etc. In an embodiment, a width of the first non-folding area NFA1 and second non-folding area NFA2 may be taken along a first direction corresponding to an extension direction of long sides of the display device 10. The first non-folding area NFA1 and second non-folding area NFA2 may have the same width, but are not limited thereto. When the folding area FDA is not specified, the first non-folding area NFA1 and the second non-folding area NFA2 may be changed according to a position at which the folding area FDA is set.

The display portion DPA of the display device 10 may be disposed in both the first non-folding area NFA1 and the second non-folding area NFA2. Further, the display portion DPA may be located even at the folding area FDA which corresponds to a boundary between the first non-folding area NFA1 and the second non-folding area NFA2. That is, the display portion DPA of the display device 10 may be continuously disposed irrespective of boundaries of the non-folding areas NFA1 and NFA2, the folding area FDA and the like. However, the present disclosure is not limited thereto, and the display portion DPA may be disposed in the first non-folding area NFA1, but may not be disposed in (e.g., excluded from) the second non-folding area NFA2. Alternatively, the display portion DPA may be disposed in the first non-folding area NFA1 and the second non-folding area NFA2, but excluded at the folding area FDA.

The display device 10 may be in-folded to dispose portions of the display surface facing each other (as illustrated in FIG. 2). The display device 10 may be out-folded to dispose portions of the display surface facing away from each other and outward from the display device 10. The display device 10 may be folded in only one manner, e.g., in-folded or out-folded. Alternatively, the display device 10 may be both in-foldable and out-foldable. The display device 10 which is both in-foldable and out-foldable, folding may be performed with respect to a same one of the folding area FDA. Alternatively, the display device 10 may be foldable with respect to a plurality of the folding area FDA, such as a folding area FDA for in-folding only and a folding area FDA for out-folding only, about which different types of folding are respectively performed.

In an embodiment, the display device 10 may include a display panel 100, a layer, a panel, a film and/or a substrate member stacked thereon, which each have flexibility. The display device 10 may be foldable by each of the aforementioned members being foldable. In an embodiment, at least a part of the display panel 100 or the members stacked thereon may have a separate shape with respect to the folding area FDA. The separated member may be located in a respective non-folding area and may not have a flexible property.

Figure 3:
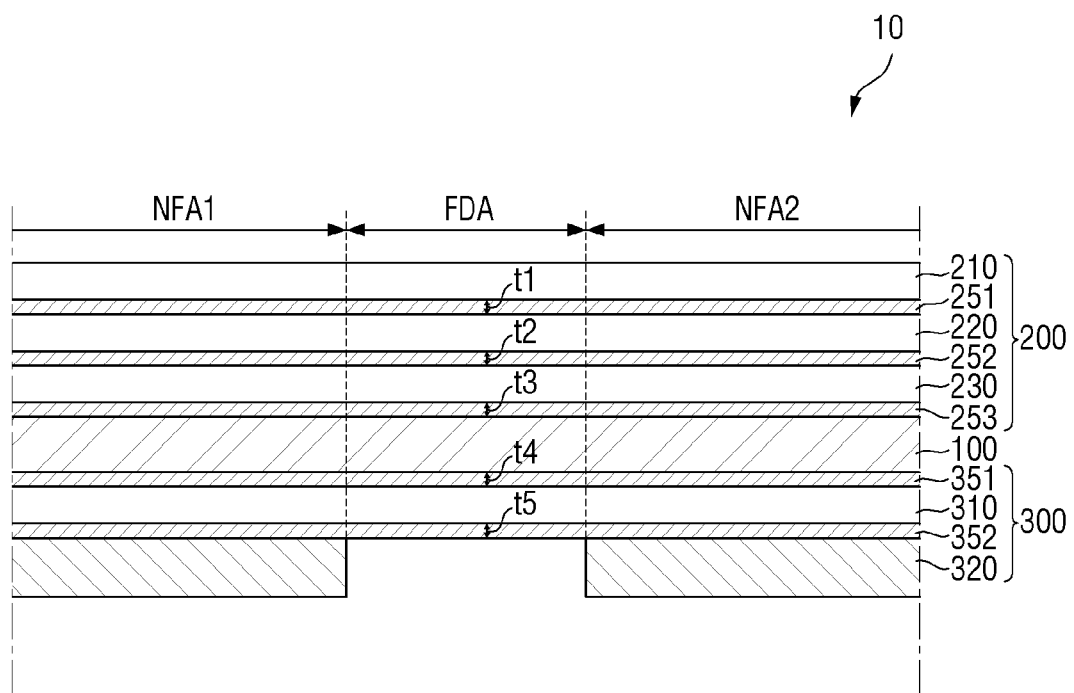
FIG. 3 is a cross-sectional view of an embodiment of a display device which is unfolded.
Figure 4:
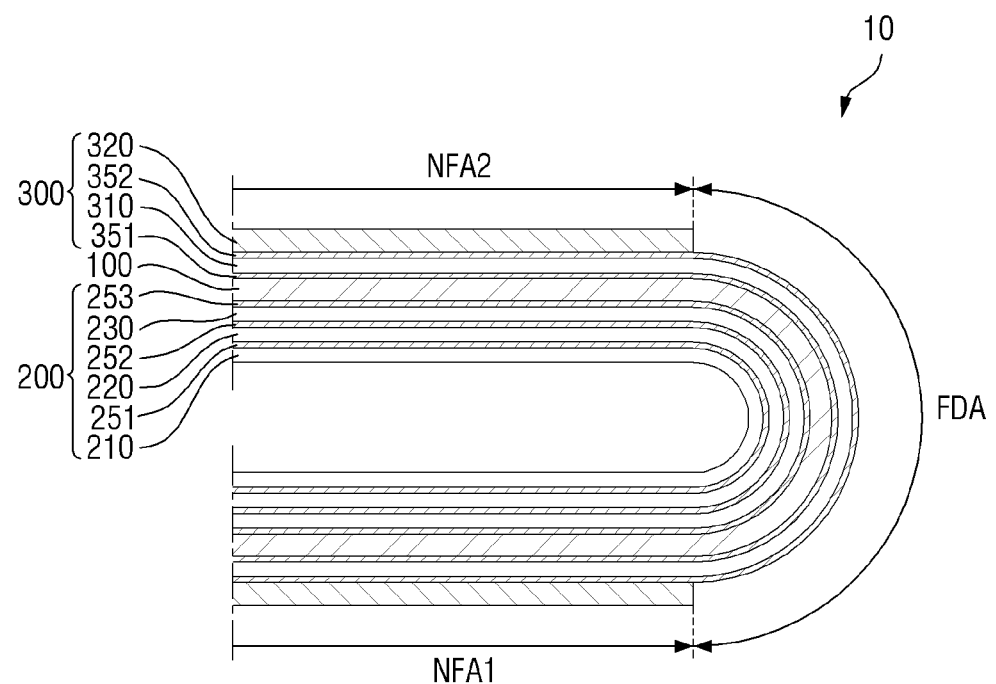
FIG. 4 is a cross-sectional view of an embodiment of a display device which is in-folded.

FIG. 3 is a cross-sectional view of an embodiment of a display device 10 which is unfolded. FIG. 4 is a cross-sectional view of an embodiment of a display device 10 which is folded.

Referring to FIGS. 3 and 4, the display device 10 may include a display panel 100, a front laminated structure 200 (e.g., first stacked structure) on the front side of the display panel 100, and a rear laminated structure 300 (e.g., second stacked structure) on the rear side of the display panel 100. The laminated structures 200 and 300 may include at least one bonding member among bonding members 251 to 253, 351 and 352. Here, the front side of the display panel 100 refers to a side at which the display panel 100 displays an image or video (e.g., side of the display screen), and the rear side refers to a side which is opposite to the front side. One surface (e.g., an upper surface) of the display panel 100 is located on the front side, and the other surface (e.g., a lower surface) of the display panel 100 is located on the rear side.

The display panel 100 is a panel which generates and/or displays an image or video. Examples of the display panel 100 may include not only a self-light emitting display panel such as an organic light emitting display ("OLED") panel, an inorganic electroluminescence ("EL") display panel, a quantum dot light emitting display ("QED") panel, a micro-LED display panel, a nano-LED display panel, a plasma display panel ("PDP"), a field emission display ("FED") panel and a cathode ray tube ("CRT") display panel, but also a light receiving display panel such as a liquid crystal display ("LCD") panel and an electrophoretic display ("EPD") panel. Hereinafter, an organic light emitting display panel will be described as an example of the display panel 100, and the organic light emitting display panel applied to the embodiment will be simply referred to as the display panel 100 unless special distinction is required. However, the embodiment is not limited to the organic light emitting display panel, and other display panels mentioned above or known in the art may be applied within the scope of the same technical ideas.

The display panel 100 may further include a touch member. The touch member may be provided as a panel or film separate from the display panel 100 and attached to the display panel 100, but may also be provided in the form of a touch layer TSL inside the display panel 100. In the following embodiment, the touch member is provided inside the display panel 100 and included in the display panel 100, but the present disclosure is not limited thereto.

Figure 5:
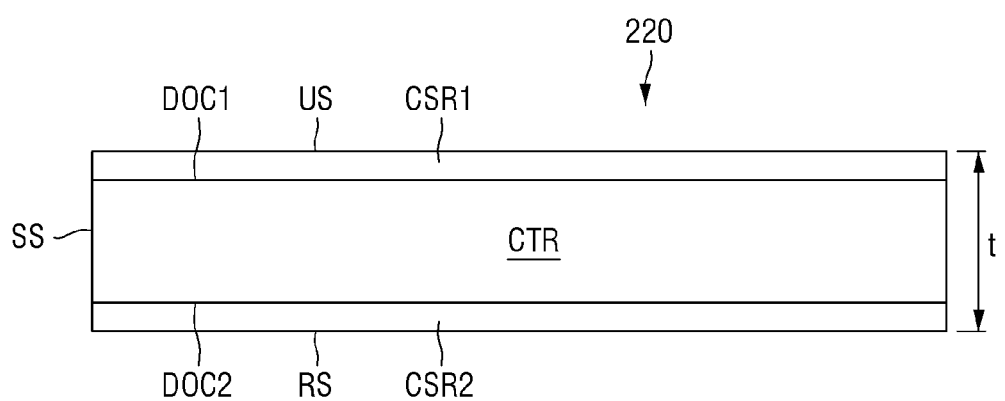
FIG. 5 is a cross-sectional view of an embodiment of a cover window.
Figure 6:
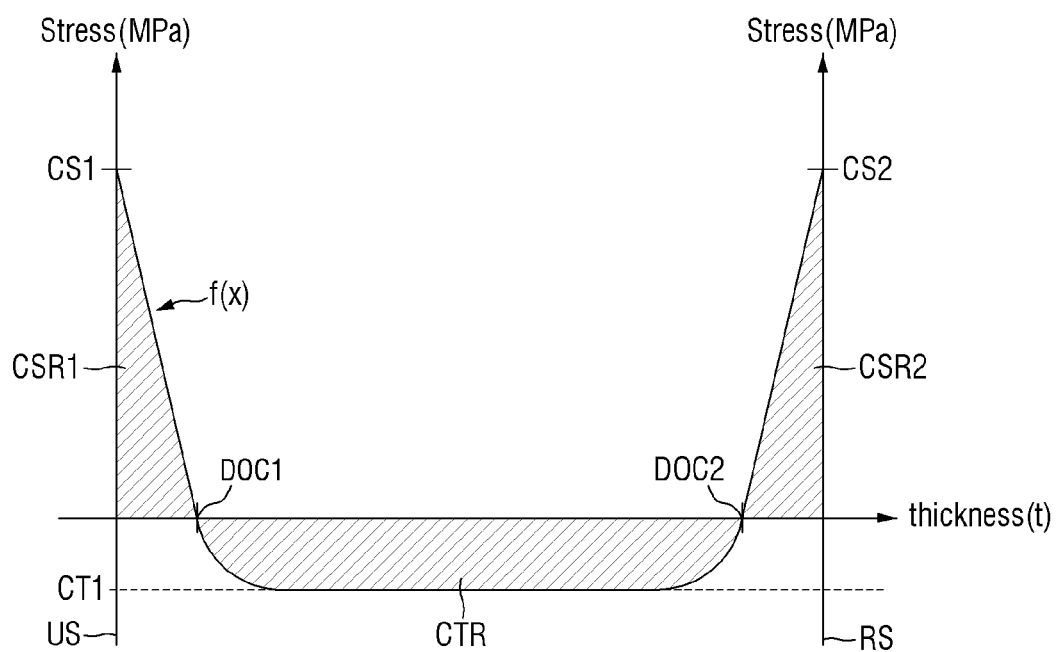
FIG. 6 is a graph showing a stress profile of an embodiment of the cover window of FIG. 5.
Figure 7:
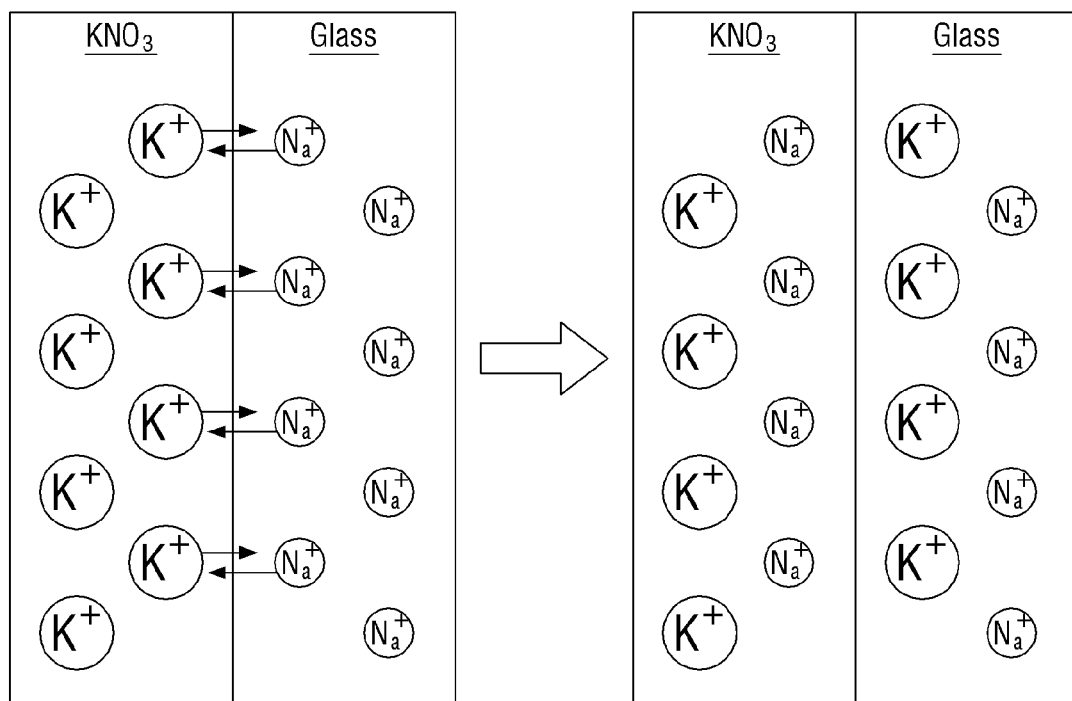
FIG. 7 is a schematic diagram illustrating an embodiment of an ion exchange process.

FIG. 5 is a cross-sectional view of an embodiment of a cover window 220. FIG. 6 is a graph showing an embodiment of a stress profile of the cover window 220 of FIG. 5. FIG. 7 is a schematic diagram illustrating an embodiment of an ion exchange process.

In an embodiment, a cover window 220 may be provided or formed through a strengthening step. The cover window 220 may include an inorganic material. In an embodiment, for example, the cover window 220 may include glass or quartz. The cover window 220 may include a glass composition.

Referring to FIGS. 5 to 7, the glass composition of the cover window 220 may include various compositions. In an embodiment, the glass composition may include lithium aluminum silicate ("LAS") glass ceramics containing lithium aluminosilicate. In an embodiment, for example, the glass composition may contain about 50 mole percent (mol %) to about 80 mol % of $SiO_2$, about 1 mol % to about 30 mol % of $Al_2O_3$, 0 to about 5 mol % of $B_2O_3$, 0 to about 4 mol % of $P_2O_5$, about 3 mol % to about 20 mol % of $Li_2O$, 0 to about 20 mol % of $Na_2O$, 0 to about 10 mol % of $K_2O$, about 3 mol % to about 20 mol % of MgO, 0 to about 20 mol % of CaO, 0 to about 20 mol % of SrO, 0 to about 15 mol % of BaO, 0 to about 10 mol % of ZnO, 0 to about 1 mol % of $TiO_2$, and 0 to about 8 mol % of $ZrO_2$ relative to the total number of moles in the composition.

As used herein, "the content being 0 mol %" means that it does not substantially contain the corresponding component. The sentence "(composition) does not substantially contain (a certain component)" as used herein means that the certain component is not intentionally contained in raw materials and the like, and includes, for example, a case in which a tiny amount (e.g., 0.1 mol % or less) of impurities are inevitably contained.

In more detail with respect to each component of the glass composition, $SiO_2$ which constitutes the skeleton of glass, may increase the chemical durability, and may serve to reduce the occurrence of cracks when scratches or indentations are made on the glass surface. In order to fully perform this role, $SiO_2$ may be contained in an amount of about 50 mol % or more. In order to exhibit sufficient meltability, $SiO_2$ in the glass composition may have a content of up to about 80 mol %.

$Al_2O_3$ serves to improve the breakage resistance of glass. That is, $Al_2O_3$ may serve to generate a smaller number of fragments when the glass is broken. In addition, $Al_2O_3$ may serve as an active component that improves ion exchange performance during chemical strengthening and increases surface compressive stress after strengthening. When the content of $Al_2O_3$ is about 1 mol % or more, the above-described function can be effectively performed. In order to maintain the acid resistance and meltability of glass, the content of $Al_2O_3$ is about 30 mol % or less.

$B_2O_3$ enhances the chipping resistance of glass and improves the meltability of glass. $B_2O_3$ may not be contained (0 mol %), but may further improve the meltability of glass when contained in an amount of about 0.5 mol % or more. $B_2O_3$ in a content of about 5 mol % or less may be advantageous in suppressing the occurrence of striae during melting.

$P_2O_5$ improves the ion exchange performance and chipping resistance. $P_2O_5$ may not be contained (0 mol %), but may significantly perform the above-described function when contained in an amount of about 0.5 mol % or more. $P_2O_5$ in a content of about 4 mol % or less may be advantageous in reducing or effectively preventing a significant decrease in breakage resistance and acid resistance.

$Li_2O$ serves to form surface compressive stress by ion exchange. Li ions near the glass surface may be exchanged with Na ions or the like through an ion exchange process. $Li_2O$ may also serve to improve the breakage resistance of glass. The content of $Li_2O$ for effective ion exchange is about 3 mol % or more, and the content of $Li_2O$ is about 20 mol % or less as related to acid resistance.

$Na_2O$ serves to form surface compressive stress by ion exchange and improve the meltability of glass. Na ions near the glass surface may be exchanged with K ions or the like through an ion exchange process. $Na_2O$ may not be contained, but if contained, the content of $Na_2O$ is about 1 mol % or more to effectively perform the above-described role. If there is only a Li and Na ion exchange process and no K ion exchange process, the content of $Na_2O$ may be about 8 mol % or less for facilitation of Li and Na ion exchange. If a K ion exchange process is also performed, a larger amount of $Na_2O$ may be used. However, the content of $Na_2O$ may be about 20 mol % or less as related to acid resistance.

$K_2O$ improves the ion exchange performance and is associated with the breakage resistance. $K_2O$ may not be contained, but may be contained in an amount of about 0.5 mol % or more to improve the ion exchange performance. In order to reduce or effectively prevent an excessive decrease in breakage resistance, the content of $K_2O$ may be about 10 mol % or less.

MgO serves to increase the surface compressive stress and improve the breakage resistance of chemically strengthened glass. This role can be effectively performed when the content of MgO is about 3 mol % or more. MgO in a content of about 20 mol % or less may be advantageous in reducing the occurrence of devitrification during glass melting.

CaO serves to improve the meltability and breakage resistance of glass. CaO may not be contained, and in order to effectively perform this role, CaO is in a content of about 0.5 mol % or more. If the content of CaO is excessively high (e.g., greater than 20 mol %), the ion exchange performance may be degraded, and thus, the content of CaO is about 20 mol % or less.

SrO serves to improve the meltability and breakage resistance of glass, similarly to CaO. SrO may not be contained, and in order to effectively perform this role, SrO is contained in a content of about 0.5 mol % or more. If the content of SrO is excessively high (e.g., greater than 20 mol %), the ion exchange performance may be degraded, and thus, the content of SrO is about 20 mol % or less.

BaO serves to improve the meltability and breakage resistance of glass. BaO may not be contained, and in order to effectively perform this role, BaO is contained in a content of about 0.5 mol % or more. BaO in a content of about 15 mol % or less may be advantageous in reducing or effectively preventing an excessive decrease in ion exchange performance.

ZnO serves to improve the meltability of glass. ZnO may not be contained, and may significantly exhibit the effect of improving meltability when contained in a content of about 0.25 mol % or more. In order to prevent a decrease in weatherability, the content of ZnO is about 10 mol % or less.

$TiO_2$ improves the breakage resistance of chemically strengthened glass. $TiO_2$ may not be contained, and may significantly exhibit the effect of improving breakage resistance when contained in a content of about 0.1 mol % or more. In order to reduce or effectively prevent devitrification during melting, the content of $TiO_2$ is about 1 mol % or less.

$ZrO_2$ may increase the surface compressive stress due to ion exchange and improve the breakage resistance of glass. $ZrO_2$ may not be contained, and may effectively perform this role when contained in a content of about 0.5 mol % or more. $ZrO_2$ in a content of about 8 mol % or less may be advantageous in suppressing devitrification during melting.

The glass composition may further include components such as $Y_2O_3$, $La_2O_3$, $Nb_2O_5$, $Ta_2O_5$ and $Gd_2O_3$, in addition to the components mentioned above. The composition of the cover window 220 may be changed through an ion exchange process or a molding process, which will be described later.

The glass composition described above may be molded into a plate glass shape by various methods. In an embodiment, the glass composition may be molded by a float process, a fusion draw process, a slot draw process or the like.

The glass which is molded into a flat plate shape may be cut through a cutting step. The glass which is molded into a flat plate shape may have a different size than that of a final glass article. Cutting of the glass may be performed using a cutting knife, a cutting wheel, a laser or the like.

Chemical strengthening may be performed through an ion exchange process. The ion exchange process is a process of exchanging first ions in glass with other (second) ions. By performing the ion exchange process, ions at or near the surface of the glass can be replaced or exchanged with larger ions having the same valence or oxidation state. In an embodiment, for example, when the glass contains a monovalent alkali metal such as Li+, Na+, K+ and Rb+, the monovalent cation on the surface may be replaced by Na+, K+, Rb+, or Cs+ ions with a larger ionic dimension (e.g., radius). Reference is made to FIG. 7 for a detailed description of the ion exchange process.

Referring to FIG. 7, when the glass containing sodium ions (Na+) is exposed to potassium ions (K+) by, for example, immersing the glass in a molten salt bath containing potassium nitrate (e.g., left view of FIG. 7), sodium ions in the glass are discharged to outside of the glass and the potassium ions may replace the discharged sodium ions (e.g., right view of FIG. 7). The exchanged potassium ions generate compressive stress within the glass because the potassium ions have a larger ionic radius than sodium ions. The greater the amount of potassium ions exchanged, the greater the compressive stress. Since the ion exchange takes place through the surface of the glass, the amount of potassium ions at the glass surface is the greatest. Although some of the exchanged potassium ions may diffuse into the glass and a distance away from the glass surface to increase the depth of a compressive region, e.g., a compression depth, the amount thereof may generally decrease in a direction away from the glass surface. Thus, the glass may have a stress profile that has the greatest compressive stress at the surface and a decreasing compressing stress toward the inside of the glass (e.g., away from the glass surface). However, the embodiments are not limited to the above examples. The stress profile may be modified depending on the temperature, time, number of times, presence or absence of heat treatment and/or the like of the ion exchange process.

The cover window 220 provided or formed through the above-described chemical strengthening may include a first surface US, a second surface RS and a side surface SS as shown in FIG. 5. In the cover window 220 having a flat plate shape, the first surface US and the second surface RS are main outer surfaces having a large planar area, and the side surface SS is an outer surface connecting the first surface US with the second surface RS.

The first surface US and the second surface RS are opposite to each other along a thickness direction. Light may mainly enter one of the first surface US and the second surface RS to be transmitted through the other one among the first surface US and the second surface RS.

A thickness t of the cover window 220 is defined as a distance between the first surface US and the second surface RS. The thickness t of the cover window 220 may be a maximum distance between the first surface US and the second surface RS. The thickness t of the cover window 220 may range, but is not limited to, from about 0.1 mm to about 2 mm. In an embodiment, the thickness t of the cover window 220 may be about 0.8 mm or less. In an embodiment, the thickness t of the cover window 220 may be about 0.75 mm or less. In an embodiment, the thickness t of the cover window 220 may be about 0.7 mm or less. In still another embodiment, the thickness t of the cover window 220 may be about 0.6 mm or less. In an embodiment, the thickness t of the cover window 220 may be about 0.65 mm or less. In an embodiment, the thickness t of the cover window 220 may be about 0.5 mm or less. In an embodiment, the thickness t of the cover window 220 may be about 0.3 mm or less. In an embodiment, the thickness t of the cover window 220 may range from about 0.45 mm to about 0.8 mm or from about 0.5 mm to about 0.75 mm. The cover window 220 may have a thickness t which is uniform, but is not limited thereto and may have a thickness t which is different for different regions of the cover window 220.

The cover window 220 may be strengthened to have a predetermined stress profile. The cover window 220 which is strengthened more efficiently reduces or prevents generation of cracks, propagation of cracks, breakage and the like due to external impact than the cover window 220 before or excluding the strengthening. The cover window 220 which is strengthened by a strengthening process may have different stresses for different regions, respectively. In an embodiment, for example, compressive regions CSR1 and CSR2 to which compressive stress is applied may be disposed in the vicinity of the surface of the cover window 220, e.g., near or extending inward from the first surface US and/or the second surface RS, and a tension region CTR to which tensile stress is applied may be disposed inside the cover window 220. The tension region CTR may be further from an outer surface (e.g., the first surface US, the second surface RS and/or the side surface SS) than the compressive regions CSR1 and CSR2. A boundary between a respective compressive region and the tensile region CTR may have a stress value of zero (e.g., neutral stress). A value of the compressive stress in one compressive region may vary depending on a position (e.g., depth from a respective outer surface). Also, a value of the tensile stress in the tensile region CTR may vary depending on the depth from a respective outer surface.

In the graph of FIG. 6, the stress profile of the cover window 220 which is strengthened is expressed as a function f(x). An x-axis represents a direction of the thickness t of the cover window 220 and ay-axis represents stress in megapascals (MPa). In FIG. 6, the compressive stress has positive values, while the tensile stress has negative values. Herein, the magnitude of the compressive stress or tensile stress means the magnitude of an absolute value regardless of being positive or negative.

Referring to FIG. 6, the cover window 220 which is strengthened includes a first compressive region CSR1 that is extended from the first surface US to a first depth (first compression depth DOC1), and a second compressive region CSR2 that is extended from the second surface RS to a second depth (second compression depth DOC2), along the thickness direction. A distance between an outer surface and a respective compression depth may define a maximum thickness of a respective compression region along the thickness t, without being limited thereto. The tensile region CTR is disposed between the first compression depth DOC1 and the second compression depth DOC2 of the cover window 220. Although not shown, a compressive region and a tensile region may be disposed between opposite side surfaces of the cover window 220 in a similar manner.

The first compressive region CSR1 and the second compressive region CSR2 are resistant to external impact to mitigate the occurrence of cracks or breakage of the cover window 220. The first compressive region CSR1 and the second compressive region CSR2 may have a first maximum compressive stress CS1 and a second maximum compressive stress CS2, respectively. The greater the maximum compressive stresses of the compressive regions CSR1 and CSR2, the greater the strength of the cover window 220. Since external impact is usually transmitted through from and through an outer surface of the cover window 220, it is advantageous to have the maximum compressive stresses at the outer surfaces of the cover window 220 in terms of durability. The first compression depth DOC1 and the second compression depth DOC2 suppress cracks or grooves which are formed starting from the first surface US and the second surface RS and propagating toward the tensile region CTR inside the cover window 220. As the first compression depth DOC1 and the second compression depth DOC2 increase, reduction or prevention of propagation of cracks and the like also increases.

In an embodiment, the first compression depth DOC1 and the second compression depth DOC2 may satisfy the following relational expression with respect to the thickness t of the cover window 220, although not limited thereto.

$$DOC1, DOC2 \geq 0.1 * t \qquad \text{[Mathematical Expression 1]}$$

Figure 8:
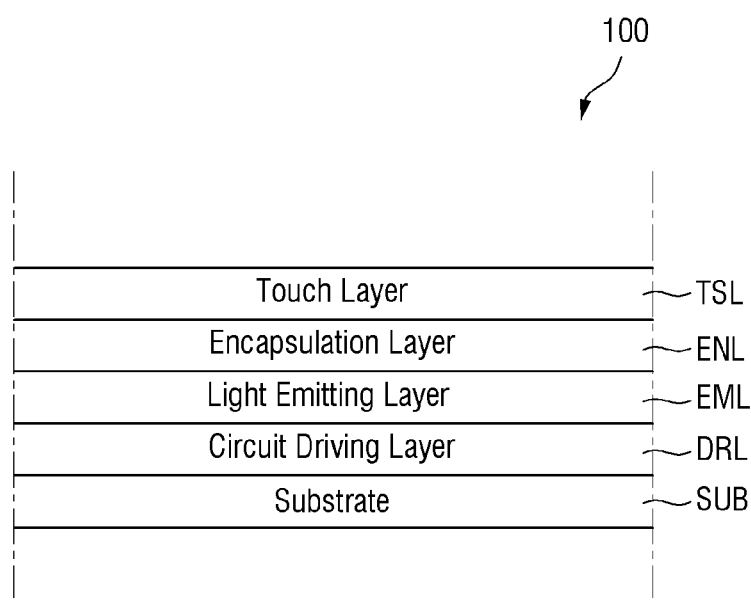
FIG. 8 is a cross-sectional view of an embodiment of a display panel.

FIG. 8 is a cross-sectional view of an embodiment of a display panel 100.

Referring to FIG. 8, the display panel 100 may include a substrate SUB, a circuit driving layer DRL on the substrate SUB, a light emitting layer EML on the circuit driving layer DRL, and an encapsulation layer ENL on the light emitting layer EML, and a touch layer TSL on the encapsulation layer ENL. That is, the circuit driving layer DRL, the light emitting layer EML, the encapsulation layer ENL and the touch layer TSL may be in order from the substrate SUB, without being limited thereto.

The substrate SUB may be a flexible substrate including a flexible polymer material such as polyimide or the like. Accordingly, the display panel 100 is twistable, bendable, foldable and/or rollable. In an embodiment, the substrate SUB may include a plurality of sub-substrates overlapping along the thickness direction with a barrier layer interposed therebetween. In this case, each sub-substrate may be a flexible substrate.

The circuit driving layer DRL may be disposed on the substrate SUB. The circuit driving layer DRL may include a circuit that drives the light emitting layer EML of a pixel to emit light. The circuit driving layer DRL may include a plurality of thin film transistors. The circuit driving layer DRL may be connected to one or more of the pixels.

The light emitting layer EML may be disposed on the circuit driving layer DRL. The light emitting layer EML may include an organic light emitting layer. The light emitting layer EML may emit light with various luminance levels according to a driving signal transmitted from the circuit driving layer DRL.

The encapsulation layer ENL may be disposed on the light emitting layer EML. The encapsulation layer ENL may include an inorganic layer or a laminated layer of an inorganic layer and an organic layer.

The touch layer TSL may be disposed on the encapsulation layer ENL. The touch layer TSL is a layer which recognizes an external input to the display device 10, and may function as a touch member. The touch layer TSL may include a plurality of touch sensing areas and touch sensing electrodes.

Referring back to FIGS. 3 and 4, the front laminated structure 200 is disposed on the front side of the display panel 100. The front laminated structure 200 may include a polarization member 230, the cover window 220 and a cover window protection layer 210, which are sequentially laminated in a direction from the display panel 100.

The polarization member 230 polarizes light passing therethrough. The polarization member 230 may serve to reduce the reflection of external light. In an embodiment, the polarization member 230 may be a polarizing film. The polarizing film may include a polarizing layer and protective substrates sandwiching the polarizing layer therebetween. The polarizing layer may include a polyvinyl alcohol film. The polarizing layer may be stretched in one direction. The stretching direction of the polarizing layer may be an absorption axis, and a direction perpendicular thereto may be a transmission axis. The protective substrates may be disposed on one surface and the other surface of the polarizing layer, respectively. The protective substrate may be made of cellulose resin such as triacetyl cellulose, polyester resin, or the like, but is not limited thereto.

The cover window 220 may be disposed on the front side of the polarization member 230. That is, the cover window 220 may face the display panel 100 with the polarization member 230 therebetween. The cover window 220 serves to protect the display panel 100. The cover window 220 may be made of a transparent material. The cover window 220 may include, for example, glass.

One or more embodiment of the cover window 220 may include ultra-thin glass ("UTG") or thin glass. When the glass is ultra-thin glass or thin glass, the cover window 220 have a flexible property such as to be twistable, bendable, foldable and/or rollable. A thickness of the glass within the cover window 220 may be, for example, in a range of about 10 micrometers (μm) to about 300 μm, such as about 30 μm to about 80 μm, or about 50 μm.

The cover window protection layer 210 may be disposed on the front side of the cover window 220. The cover window protection layer 210 may perform at least one function among scattering prevention, impact absorption, scratch prevention, fingerprint or smudge prevention and glare prevention relative to the cover window 220. The cover window protection layer 210 may include or be formed to include a transparent polymer film. The transparent polymer film include at least one of polyethylene terephthalate ("PET"), polyethylene naphthalate ("PEN"), polyether sulfone ("PES"), polyimide ("PI"), polyarylate ("PAR"), polycarbonate ("PC"), polymethyl methacrylate ("PMMA") or cycloolefin copolymer ("COC").

The front laminated structure 200 may include front bonding members 251 to 253 for bonding adjacent layers to each other. In an embodiment, for example, a first bonding member 251 may be disposed between the cover window protection layer 210 and the cover window 220 to bond them to each other, a second bonding member 252 may be disposed between the cover window 220 and the polarization member 230 to bond them to each other. A third bonding member 253 may be disposed between the polarization member 230 and the display panel 100 to bond them to each other. That is, the front bonding members 251 to 253 may be members that attach layers to a front surface of the display panel 100. The first bonding member 251 may be a protection layer bonding member for attaching the cover window protection layer 210, the second bonding member 252 may be a window bonding member for attaching the cover window 220, and the third bonding member 253 may be a polarization portion bonding member for attaching the polarization member 230. The front bonding members 251 to 253 may all be optically transparent.

The rear laminated structure 300 is disposed on the rear side of the display panel 100. The rear laminated structure 300 may include a polymer film layer 310 and a heat dissipation member 320, which are sequentially laminated from the display panel 100.

The polymer film layer 310 may include a polymer film. The polymer film layer 310 may include, for example, polyimide ("PI"), polyethylene terephthalate ("PET"), polycarbonate ("PC"), polyethylene ("PE"), polypropylene ("PP"), polysulfone ("PSF"), polymethylmethacrylate ("PMMA"), triacetylcellulose ("TAC"), cycloolefin polymer ("COP") or the like. The polymer film layer 310 may include a functional layer on at least one surface thereof. The functional layer may include, for example, a light absorbing layer. The light absorbing layer may include a light absorbing material such as a black pigment or dye. The light absorbing layer may be formed by coating or printing black ink on a polymer film.

The heat dissipation member 320 may be disposed on the rear side of the polymer film layer 310. The heat dissipation member 320 serves to diffuse heat generated from the display panel 100 or other parts of the display device 10. The heat dissipation member 320 may include a metal plate. The metal plate may include, for example, a metal having excellent thermal conductivity, such as copper and silver. The heat dissipation member 320 may be a heat dissipation sheet including graphite, carbon nanotubes or the like.

The heat dissipation member 320 may be separated or disconnected at the folding area FDA to facilitate folding of the display device 10 as illustrated in FIGS. 3 and 4, although not limited thereto. In an embodiment, for example, a first metal plate of the heat dissipation member 320 may be disposed in the first non-folding area NFA1, and a second metal plate of the heat dissipation member 320 may be disposed in the second non-folding area NFA2. The first metal plate and the second metal plate may be physically separated from each other with respect to the folding area FDA.

The rear laminated structure 300 may include rear bonding members 351 and 352 for bonding adjacent layers to each other. In an embodiment, for example, a fourth bonding member 351 may be disposed between the display panel 100 and the polymer film layer 310 to bond them to each other, and a fifth bonding member 352 may be disposed between the polymer film layer 310 and the heat dissipation member 320 to bond them to each other. That is, among the rear bonding members 351 and 352 which are members for attaching the layers on the rear surface of the display panel 100, the fourth bonding member 351 may be a polymer film layer bonding member for attaching the polymer film layer 310, and the fifth bonding member 352 may be a heat dissipation portion bonding member for attaching the heat dissipation member 320. When the heat dissipation member 320 is separated or disconnected with respect to the folding area FDA, the fifth bonding member 352 may also be separated or disconnected in the same way, but may be continuous as illustrated in FIG. 3 without being separated or disconnected for respective non-folding areas.

When the display device 10 displays an image only on the front surface, the rear bonding members 351 and 352 may not be optically transparent, unlike the front bonding members 251 to 253 which are optically transparent.

Each of the front bonding members 251 to 253 and the rear bonding members 351 and 352 described above may include an adhesive material. Each of the bonding members may include a pressure sensitive adhesive layer and may hereinafter generally be referred to as an adhesive layer PSA. The bonding members may have the same composition as each other, or may have different compositions from each other according to the positions thereof within the stacked structure of the display device 10 and the various layers thereof to be bonded to each other.

One or more of the front bonding members 251 to 253 may also include an optically transparent adhesive layer or optically transparent resin. In an embodiment, for example, the second bonding member 252 used for bonding the cover window 220 to the display panel 100 may include an optically transparent adhesive layer or an optically transparent resin. However, the present disclosure is not limited thereto.

Each of the first to fifth bonding members 251 to 253, 351 and 352 may have a thickness of about 300 μm or less. In an embodiment, each of the bonding members 251 to 253, 351 and 352 may have a thickness of about 200 μm or less, among which one or more of the bonding members 251 to 253, 351 and 352 may have a thickness of about 100 μm or less. The lower limit of the thickness of the bonding members 251 to 253, 351 and 352 may be varied such as being about 10 μm or more, such as about 50 μm or more, in order to secure a minimum adhesive strength.

Each of the bonding members 251 to 253, 351 and 352 may be provided or formed of a single adhesive layer, or may be provided or formed of a multilayer or stacked structure including a plurality of adhesive layers. Further, each of the bonding members 251 to 253, 351 and 352 may include adhesive layers on each of opposing surfaces thereof, respectively, similarly to a double-sided tape.

In an embodiment, the bonding members 251 to 253, 351 and 352 may include a silicone-based adhesive. The silicone-based adhesive may include siloxane resin. The silicone-based adhesive may include a silicone gum containing a polyorganosiloxane compound. The silicone gum may include a cross-linkable functional group such as a vinyl group. The silicone-based adhesive may further include MQ resin having a molecular structure of a three-dimensional network containing a monofunctional siloxane unit and a tetrafunctional siloxane unit. The silicone-based adhesive may further include an additive containing at least one of a borane compound or a borate compound.

In an embodiment, the bonding members 251 to 253, 351 and 352 may include an acrylic adhesive. The acrylic adhesive may include an acrylic polymer. The acrylic polymer is produced by polymerizing acrylic monomers which may be the main material of acrylic polymers. The acrylic monomer may include ethyl acrylate, n-butyl acrylate, t-butyl acrylate, isobutyl acrylate, n-hexyl acrylate, 2-ethylhexyl acrylate, n-octyl acrylate, isooctyl acrylate, n-nonyl acrylate, isononyl acrylate, n-decyl acrylate, isodecyl acrylate, n-dodecyl acrylate, n-tridecyl acrylate, n-tetradecyl acrylate, 2-(2-ethoxyethoxy)ethyl acrylate, 2-hydroxyethyl acrylate, 2-hydroxypropyl acrylate, 3-hydroxypropyl acrylate, 2-hydroxybutyl acrylate, 4-hydroxybutyl acrylate, 6-hydroxyhexyl acrylate, 8-hydroxyoctyl acrylate, 10-hydroxydecyl acrylate, 12-hydroxylauryl acrylate, [4-(hydroxymethyl)cyclohexyl]methyl acrylate, and/or the like. The acrylic adhesive may also include an azo initiator such as 2,2'-azobisisobutyronitrile, a filler such as silica or zirconia, a crosslinking agent, an anti-static agent such as PEDOT:PSS (poly ethylenedioxythiophene:polystyrene sulfonate) or the like, in addition to the acrylic polymer. In an embodiment, the acrylic adhesive may be fabricated by combining about 120 to about 250 parts by weight of the acrylic monomer with a solvent and stirring the combination while heating, and adding about 0.1 to about 1 part by weight of an azo initiator, about 0.5 to about 1 part by weight of a filler, about 1.5 to about 2.5 parts by weight of a crosslinking agent, and about 0.5 to about 1 part by weight of an anti-static agent into the solution and stirring the solution while heating.

In an embodiment, the bonding members 251 to 253, 351 and 352 may include a crystalline polymer and a rubber-based polymer. The crystalline polymer may be polypropylene, syndiotatic polystyrene, polyamide, polycaprolactone, polycarbonate-diol, polyethylene terephthalate ("PET"), polyphenylene sulfide, polybutylene terephthalate ("PBT"), polyarylate ("PAR"), poly(DPAA), polyetherimide ("PEI"), polyacetal, and/or polyoxymethylene ("POM").

The rubber-based polymer may be polybutadiene, polyisoprene, polyneoprene, polyisobutylene, cellulose acetate, polyvinyl acetate, a copolymer thereof, or the like. The weight ratio of the crystalline polymer and the rubber-based polymer may be equal to or greater than about 1:1.5 and equal to or smaller than about 1:0.3. The bonding member may further include a carbamic acid ester-based polymer, an ester-based polymer, and/or a (meth) acrylic acid ester-based polymer. The bonding member may further include a coupling agent such as a silane-based coupling agent, a titanate-based coupling agent, or a chromium-based coupling agent, an adhesion promoter such as rosin resin, rosin ester resin, terpene phenolic resin or terpene resin, a yellowing inhibitor, antioxidant, or the like.

The constituent materials and compositions of the bonding members 251 to 253, 351 and 352 are not limited to those exemplified above, and other configurations or compositions of adhesive materials known in the art may be applied thereto.

The front bonding members 251 to 253 and the rear bonding members 351 and 352 may have adhesive properties such as predetermined modulus and creep characteristics. Modulus and creep characteristics are related to deformation or restoration with respect to pressure applied to the adhesive layer PSA. However, since the bonding members 251 to 253, 351 and 352 are exposed to different stress conditions according to their positions within the display device 10, and the types of adhered members around them are different, different adhesive properties may be required for each position within the display device 10.

The display device 10 which has the laminated structures as described above and is folded, subjects the respective layers constituting the display device 10 to different stresses. In an embodiment, for example, when the display surface is in-folded to dispose portions of the display surface facing each other, layers closer to the display surface (e.g., the front surface) may be subjected to compressive stress, and layers closer to the surface opposite to the display surface (e.g., the rear surface) may be subjected to tensile stress.

In the display device 10 which is in-folded, the compressive stress may become the maximum at the front surface of the display device 10, and may decrease in magnitude toward the rear surface along the thickness direction. The tensile stress may become the maximum at the rear surface of the display device 10, and may decrease in magnitude toward the front surface along the thickness direction. A stress neutral plane in which compressive stress and tensile stress are balanced (e.g., values of compressive stress and tensile stress are both zero) may be located at an intermediate portion of the display device 10 along the thickness direction. In an embodiment, for example, the stress neutral plane may be designed to be located inside the display panel 100 between the front laminated structure 200 and the rear laminated structure 300 along the thickness direction. In the display device 10 which is in-folded, the front laminated structure 200 located at a front side of the display panel 100 may be exposed to compressive stress, and the rear laminated structure 300 located at a rear side of the display panel 100 may be exposed to tensile stress.

Since the bonding members 251 to 253, 351 and 352 of the display device 10 are exposed to various stresses as described above during folding of the display device 10, adhesive properties are defined corresponding to locations of respective bonding members in order to maintain adhesive strength between layers of the display device 10 and to have a restoration force of layer even in repeated folding and unfolding of the display device 10.

An average modulus of the front bonding members 251 to 253 as an average of moduli of the respective bonding members belonging to the front bonding members 251 to 253 may be smaller than an average modulus of the rear bonding members 351 and 352 as an average of moduli of the respective bonding members belonging to the rear bonding members 351 and 352. The modulus of the respective bonding member is expressed as a ratio of the stress and the strain, and a smaller modulus may mean that deformation more easily occurs for the same stress. In an embodiment, the front bonding members 251 to 253 subjected to compressive stress may have a relatively small modulus which is advantageous in preventing defective film removal due to compressive stress. In contrast, the rear bonding members 351 and 352 may have a relative large modulus which is advantageous in providing a high restoration rate in order to return layers to an original state after folding thereof.

However, as described above, the cover window 220 may include an inorganic material. Thus, among the front bonding members 251 to 253, the first bonding member 251 and the second bonding member 252 in contact with the cover window 220 may have a large modulus in order to increase adhesive strength with the cover window 220 including an inorganic material to reduce or effectively prevent defective film removal due to compressive stress. As being in contact, elements or layers may form an interface therebetween.

From the above standpoint, the modulus of the bonding members 251 to 253, 351 and 352 may range from about 1 MPa to about 10 MPa. In an embodiment, for example, adhesive strength with the cover window 220 in contact therewith may be increased by setting the modulus of the bonding members 251 and 252 to 1 MPa or more, and defective film removal due to compressive stress may be prevented by setting the modulus to 10 MPa or less.

The first bonding member 251 may have a first thickness t1, the second bonding member 252 may have a second thickness t2, and the third bonding member 253 may have a third thickness t3, the fourth bonding member 351 may have a fourth thickness t4, and the fifth bonding member 352 may have a fifth thickness t5.

In an embodiment, for example, the modulus of the first bonding member 251 may be greater than that of the second bonding member 252. The first thickness t1 of the first bonding member 251 may be smaller than the second thickness t2 of the second bonding member 252. In an embodiment, for example, the first thickness t1 of the first bonding member 251 may be about 10 μm smaller than the second thickness t2 of the second bonding member 252. Although the first thickness t1 of the first bonding member 251 is smaller than the second thickness t2 of the second bonding member 252, the modulus of the first bonding member 251 is designed to be larger than that of the second bonding member 252, thereby further increasing adhesive strength with the cover window 220 in contact therewith.

In addition, the modulus of the fourth bonding member 351 may be greater than that of the fifth bonding member 352. The fourth thickness t4 of the fourth bonding member 351 may be smaller than the fifth thickness t5 of the fifth bonding member 352. Although the fourth thickness t4 of the fourth bonding member 351 is smaller than the fifth thickness t5 of the fifth bonding member 352, the modulus of the fourth bonding member 351 is designed to be larger than that of the fifth bonding member 352, thereby further increasing the restoration rate for returning layers to an original form (e.g., unfolded form) after folding.

In addition, the modulus of the fourth bonding member 351 may be greater than the modulus of each of the first bonding member 251 and the third bonding member 253. In the display panel 100 which has a driving chip (e.g., a data driving integrated circuit) attached thereto and is folded, stress is generated by the driving chip, and this stress may cause the occurrence of cracks in the display panel 100. However, since the modulus of the fourth bonding member 351 is larger than that of each of the first bonding member 251 and the third bonding member 253, cracks in the display panel 100 due to stress generated by the driving chip when the display panel 100 is folded may be reduced or effectively prevented.

In an embodiment, for example, the modulus of the fourth bonding member 351 may be about 3 MPa to about 10 MPa, such as about 4 MPa to about 6 MPa, but is not limited thereto.

In an embodiment, the modulus of the bonding members 251 to 253, 351 and 352 may be a modulus value measured for respective bonding members in a thin film state such as having a thickness of about 300 μm or less, about 200 μm or less, or about 100 μm or less. Further, the modulus of the bonding members 251 to 253, 351 and 352 described above may be a value measured for respective bonding members extracted from the display device 10 after having been included in the display device 10. The modulus of the adhesive layer PSA of such a thin film may be measured by an indenter, such as a bio-indenter or a nano-indenter. That is, the modulus of the adhesive layer PSA as a thin film may be measured by an indenter evaluation method.

The creep characteristic, which is another characteristic of the adhesive layers PSA, is generally proportional to viscosity, and the first to fifth bonding members 251 to 253, 351 and 352 may all be in a range of about 20% to about 70%. When the creep characteristic is less than 20%, the deformation may be incomplete in the folding operation, and when the creep characteristic exceeds 70%, the restoration may be insufficient.

In an embodiment, among the front bonding members 251 to 253, each of the creep characteristics of the second bonding member 252 and the third bonding member 253 may be smaller than the creep characteristic of the first bonding member 251. Among the front bonding members 251 to 253, since each of the creep characteristics of the second bonding member 252 and the third bonding member 253 may be smaller than the creep characteristic of the first bonding member 251, permeation of moisture into the display panel 100 from the outside (or from the top) may be reduced or effectively prevented. In an embodiment, for example, creep characteristics of the second bonding member 252 and the third bonding member 253 may be about 20% to about 45%. In an embodiment, since the third bonding member 253 is located closer to the display panel 100 than the second bonding member 252, the creep characteristic of the third bonding member 253 may be smaller than the creep characteristic of the second bonding member 252. In addition, each of the creep characteristics of the second bonding member 252 and the third bonding member 253 may be smaller than that of the rear bonding members 351 and 352.

The above-described creep characteristics may also be measured by using the indenter, and the values measured for the bonding members 251 to 253, 351 and 352 in the thin film state or in the state of being separated from the display device 10 to which the respective bonding member has been applied may be in a range of about 20% to about 70%. In an embodiment, the modulus and creep characteristic of the window bonding member, the modulus and creep characteristic of the protection layer bonding member, and the modulus and creep characteristic of the polarization bonding member are measured values of indenter-measurement of a respective bonding member among the window bonding member, the protection layer bonding member and the polarization bonding member which has the thickness of about 300 micrometers or less (e.g., a thin film state). The modulus and the creep characteristic of the respective bonding member are measured values corresponding to a ball-shaped indenter indention depth into the respective bonding member which has the thickness of about 300 micrometers or less.

The creep characteristic of each of the fourth bonding member 351 and the fifth bonding member 352 may be greater than the creep characteristic of the second bonding member 252.

Hereinafter, a description is made of an embodiment of a method for measuring the modulus and creep characteristic of an adhesive layer PSA an indenter.

Figure 9:
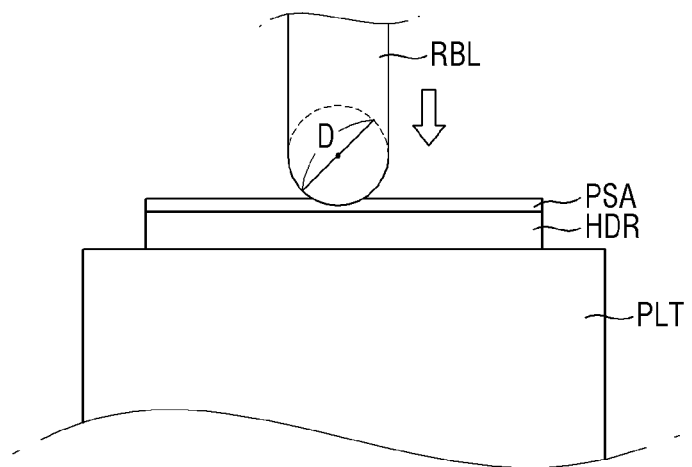
FIG. 9 is a schematic view illustrating an embodiment of a method for measuring a modulus and creep characteristic of an adhesive layer by a bio-indenter.

FIG. 9 is a schematic cross-section view illustrating an embodiment of a method for measuring a modulus and creep characteristic of an adhesive layer PSA by a bio-indenter.

Referring to FIG. 9, the bio-indenter includes an indenter RBL. The indenter RBL may have a shape of a ball (Ruby ball) or at least a partial shape of the ball. The ball shape of the indenter RBL may has a diameter D of about 1 mm without being limited thereto.

In an embodiment, an adhesive layer PSA as a measurement target has a size of about 2 centimeters (cm)×about 2 cm. Where a heterogeneous film is pre-adhered to the adhesive layer PSA, after the heterogeneous film is removed, the adhesive layer PSA is attached to a flat holder HDR which is on a plate PLT. The indenter RBL presses the surface of the adhesive layer PSA (indicated by the downward arrow in FIG. 9) with a maximum load of about 0.2 millinewton (mN), which is maintained for 120 seconds. Here, the loading/unloading speed, e.g., the pressing speed, of the indenter RBL may be about 1.2 millinewtons per minute (mN/min). During the pressing operation, an indentation is formed in the adhesive layer PSA. An indentation depth of the indention is measured. The indentation test with the indenter RBL of the bio-indenter may be carried out at a plurality of points, e.g., 15 points, on a sample of a measurement target, and the indentation depth of such measurement target may be represented by an average of a plurality of test results.

Figure 10:
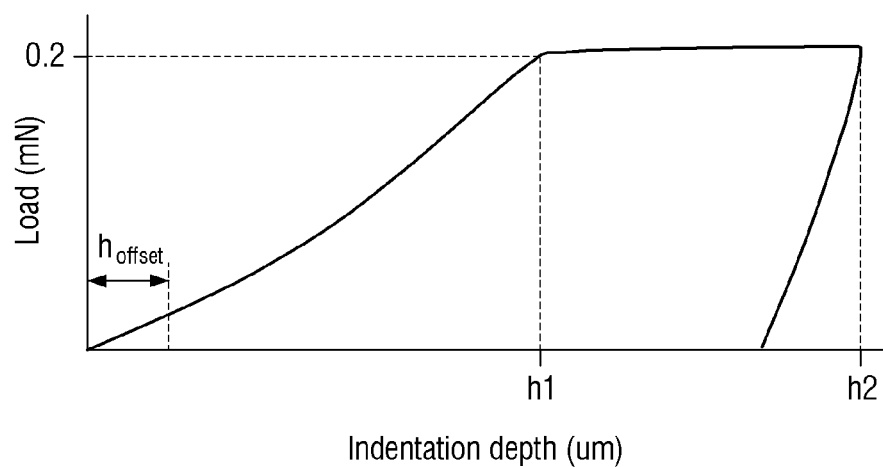
FIG. 10 is a graph showing an embodiment of a relationship between an indentation depth and a load in indenter-measurement process.
Figure 11:
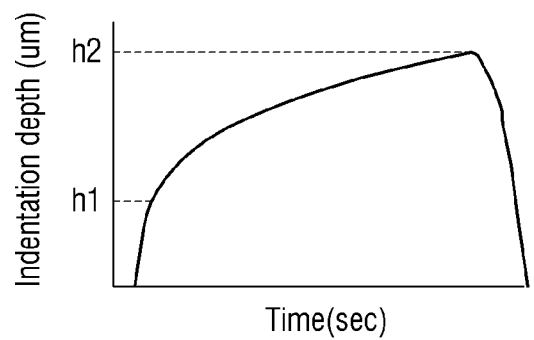
FIG. 11 is a graph showing an embodiment of an indentation depth according to time before and after a maximum load maintenance period in an indenter-measurement process.

FIG. 10 is a graph showing a relationship between an indentation depth (μm) and a load (mN). FIG. 11 is a graph showing an indentation depth varying relative to a maximum load maintenance period. In FIGS. 10 and 11, h1 denotes an indentation depth at the time point when the maximum load is reached, and h2 is an indentation depth at the time point when the maximum load maintenance period expires.

Referring to FIGS. 10 and 11, as the indentation load of the indenter RBL increases, the indentation depth of the indenter RBL increases. Because the deformation rate to the stress increases as the modulus of the adhesive layer PSA decreases, the indentation depth to the indentation load in FIG. 10 increases as the modulus decreases. The indentation depth continues to increase even while the maximum load to the indenter RBL is maintained because of the viscosity of the adhesive layer PSA. The indentation depth tends to increase during the maximum load maintenance period mostly as the creep characteristic increases. The indentation depth increase rate during the maximum load maintenance period gradually decreases (slope decreasing in FIG. 11) as time progresses, and the indentation depth may be maintained at a specific value without further increasing at a certain time point even though the maintenance period elongates. The indenter RBL is unloaded from the measurement target, the indentation depth decreases, where the stronger the restoration force, the faster the indentation depth may decrease after the indenter RBL is completely unloaded.

After the indentation depth is measured as described above, a modulus E* may be calculated through Eq. 1 as follows.

$$P = \frac{4}{3} E^* \sqrt{R} \sqrt{h^3} \qquad \text{Eq. 1}$$

In Eq. 1, P denotes the maximum load, R denotes the radius of the indenter RBL, and h denotes the indentation depth. Here, the indentation depth denotes a maximum load reaching depth h1. Where the bio-indenter has a predetermined offset depth ($h_{offset}$), the indentation depth of Eq. 1 may be represented as a value obtained by subtracting the offset depth ($h_{offset}$) from the maximum load reaching depth h1 measured by the bio-indenter. The offset depth ($h_{offset}$) is an offset perceived as if the surface of the adhesive layer PSA is indented by the van der Waals force even though the indenter RBL approaches without pressing yet when the bio indenter measures the indentation depth. The actual indentation depth may be calculated by subtracting the offset depth ($h_{offset}$) from the indentation depth measured by the bio-indenter. In order to reduce the measurement error caused by the offset depth ($h_{offset}$), it may be possible to calculate the modulus by setting a loading slope range from about 30% to about 98% (about 0.06 mN~about 0.196 mN) of the maximum load in the indentation depth-load graph.

The creep characteristic ($C_{IT}$) may also be calculated through Eq. 2.

$$C_{IT} = \frac{h_2 - h_1}{h_1} \cdot 100 \qquad \text{Eq. 2}$$

In the same manner as described above, the bonding members 251 to 253, 351 and 352 of the display device 10 have modulus and creep characteristics for each position, thereby precisely managing adhesive properties such as restoration force and prevention of defective film removal according to the position of the bonding members 251 to 253, 351 and 352 applied to the display device 10.

Hereinafter, embodiments of the display device 10 will be further described. In the following embodiments, the same components as those of the above-described embodiment are denoted by the same reference numerals, and descriptions thereof will be omitted or simplified.

Figure 12:
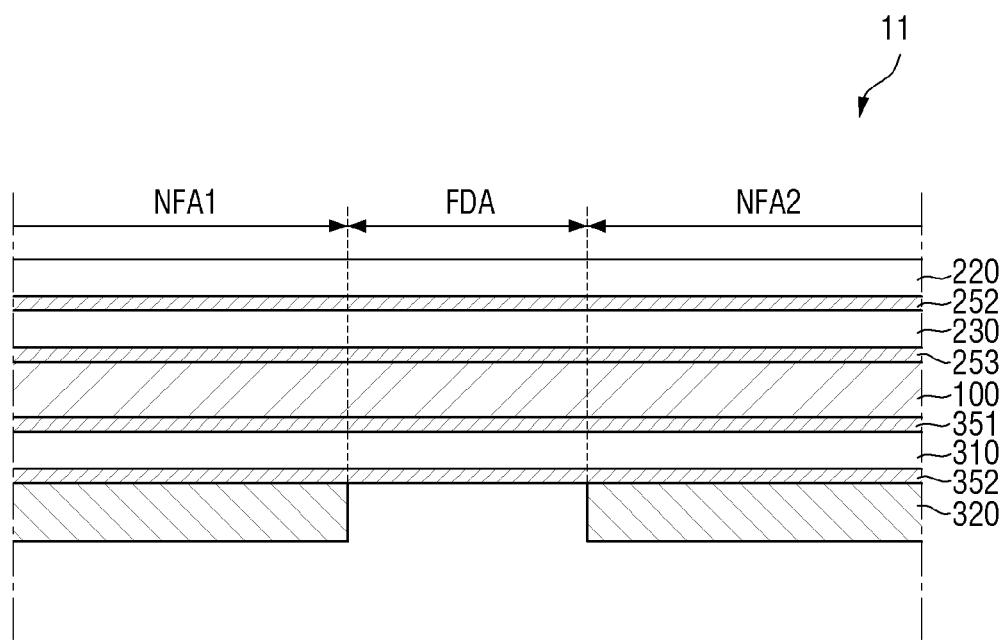
FIG. 12 is a cross-sectional view of an embodiment of a display device.
Figure 14:
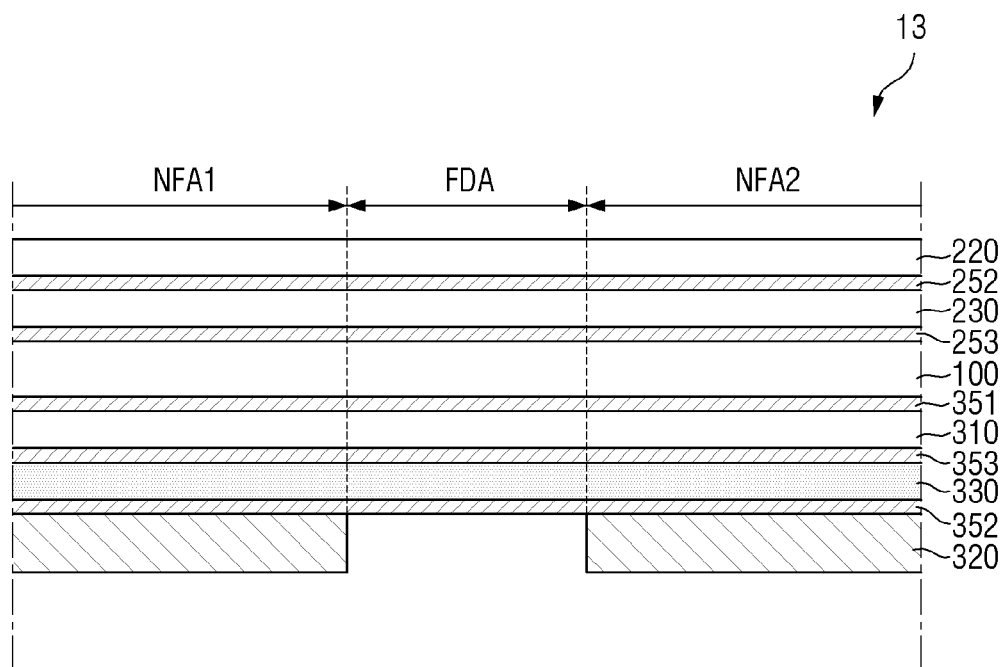
FIG. 14 is a cross-sectional view of an embodiment of a display device.

FIGS. 12 and 14 illustrate embodiments of various stacked structures around the display panel 100.

FIG. 12 is a cross-sectional view of an embodiment of a display device 11.

Referring to FIG. 12, a display device 11 is different from the embodiment of FIG. 3 in that the cover window protection layer 210 and the first bonding member 251 are omitted. In this embodiment, the modulus of the first bonding member 251 and the modulus of the second bonding member 252 in the thin film state measured by using the indenter may each range from about 1 MPa to about 10 MPa. The modulus of the fourth bonding member 351 may be greater than that of each of the first bonding member 251 and third bonding member 253. The creep characteristic of each of the second bonding member 252 and the third bonding member 253 may be smaller than that of the rear bonding members 351 and 352.

Other descriptions have been previously made, and thus, a redundant description will be omitted.

Figure 13:
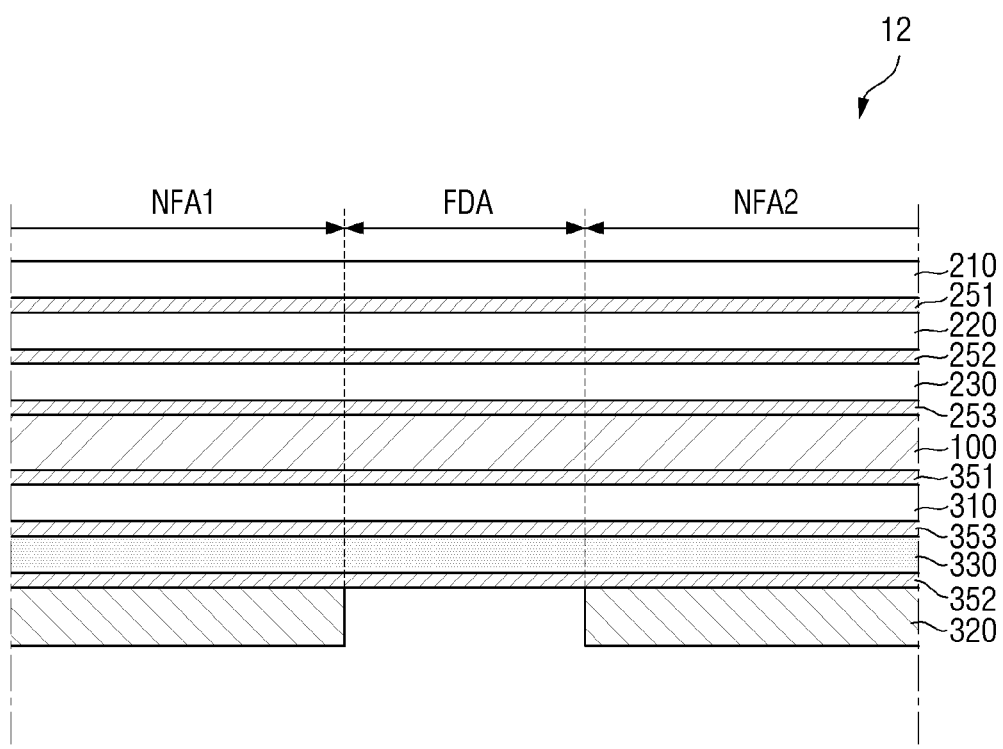
FIG. 13 is a cross-sectional view of an embodiment of a display device.

FIG. 13 is a cross-sectional view of an embodiment of a display device according to still another embodiment.

Referring to FIG. 13, a display device 12 is different from the embodiment of FIG. 3 in that the rear laminated structure further includes a buffer member 350 and a sixth bonding member 353.

The buffer member 350 may be disposed between the polymer film layer 310 and the heat dissipation member 320. The buffer member 350 may absorb external impact to reduce or effectively prevent damage to the display device 12. The buffer member 350 may be provided or formed of a single layer or a plurality of laminated layers. The buffer member 350 may include, for example, a material having elasticity such as polyurethane or polyethylene resin. The buffer member 350 may be a cushion layer.

The sixth bonding member 353 is disposed between the buffer member 350 and the polymer film layer 310 to bond them to each other. The fifth bonding member 352 may be disposed between the buffer member 350 and the heat dissipation member 320 to bond them to each other. The sixth bonding member 353 may be a buffer portion bonding member that attaches the buffer member 350 on the rear surface of the display panel 100.

The sixth bonding member 353 may have adhesive properties similar to those of the fifth bonding member 352. That is, the sixth bonding member 353 may have the same thickness as that of the fifth bonding member 352 or within a thickness range applicable to the fifth bonding member 352. The modulus of the sixth bonding member 353 which is in the thin film form and measured using the indenter may be in a range of about 1 MPa to about 10 MPa, and the creep characteristic thereof may be in a range of about 20% to about 70%.

FIG. 14 is a cross-sectional view of an embodiment of a display device 13.

Referring to FIG. 14, a display device 13 is different from the embodiment of FIG. 13 in that the cover window protection layer 210 and the first bonding member 251 are omitted. The configurations of the structure in FIG. 14 can be easily understood from those described with reference to FIGS. 3, 12 and 13, and thus redundant description is omitted.

Hereinafter, the embodiments will be described in more detail through fabrication examples and experimental examples.

Fabrication Example 1: Fabrication of Display Devices

A plurality of display device samples having the laminated structure shown in FIG. 3 were fabricated.

Fabrication Example 2: Extraction of Adhesive Samples

Adhesive samples were extracted while separating each layer from one display device sample. As the extracted adhesive samples, Adhesive #1 was applied as the first bonding member 251, Adhesive #2 was applied as the second bonding member 252, Adhesive #3 was applied as the third bonding member 253, Adhesive #4 was applied as the fourth bonding member 351 and Adhesive #5 was applied as the fifth bonding member 352.

Experimental Example 1: Measurement of Modulus and Creep Characteristic

Each adhesive sample was cut out to have a size of 2 cm×2 cm, and the modulus and creep characteristic measurement was performed thereon with an indenter evaluation method. The indenter evaluation method was carried out by applying and maintaining a maximum load of 0.2 mN to each sample for 120 seconds with a ball indenter made of a ruby material and having a diameter of 1 mm. The loading/unloading speed was maintained at 1.2 mN/min. Per-point indent indentation depths were measured, and the modulus and creep characteristic were measured using a value obtained by averaging the per-point indent indentation depths. The results were shown in Table 1 below, and the relationship between the indentation depth and the load according to the measurement result was shown in FIG. 15.

TABLE 1

| | | Adhesive #1 | Adhesive #2 | Adhesive #3 | Adhesive #4 | Adhesive #5 |
|---|---|---|---|---|---|---|
| Indenter | Modulus (MPa) | 2.3 | 1.7 | 2.3 | 5.0 | 2.2 |
| | Creep Characteristic (%) | 65 | 40 | 23 | 72 | 53 |

Figure 15:
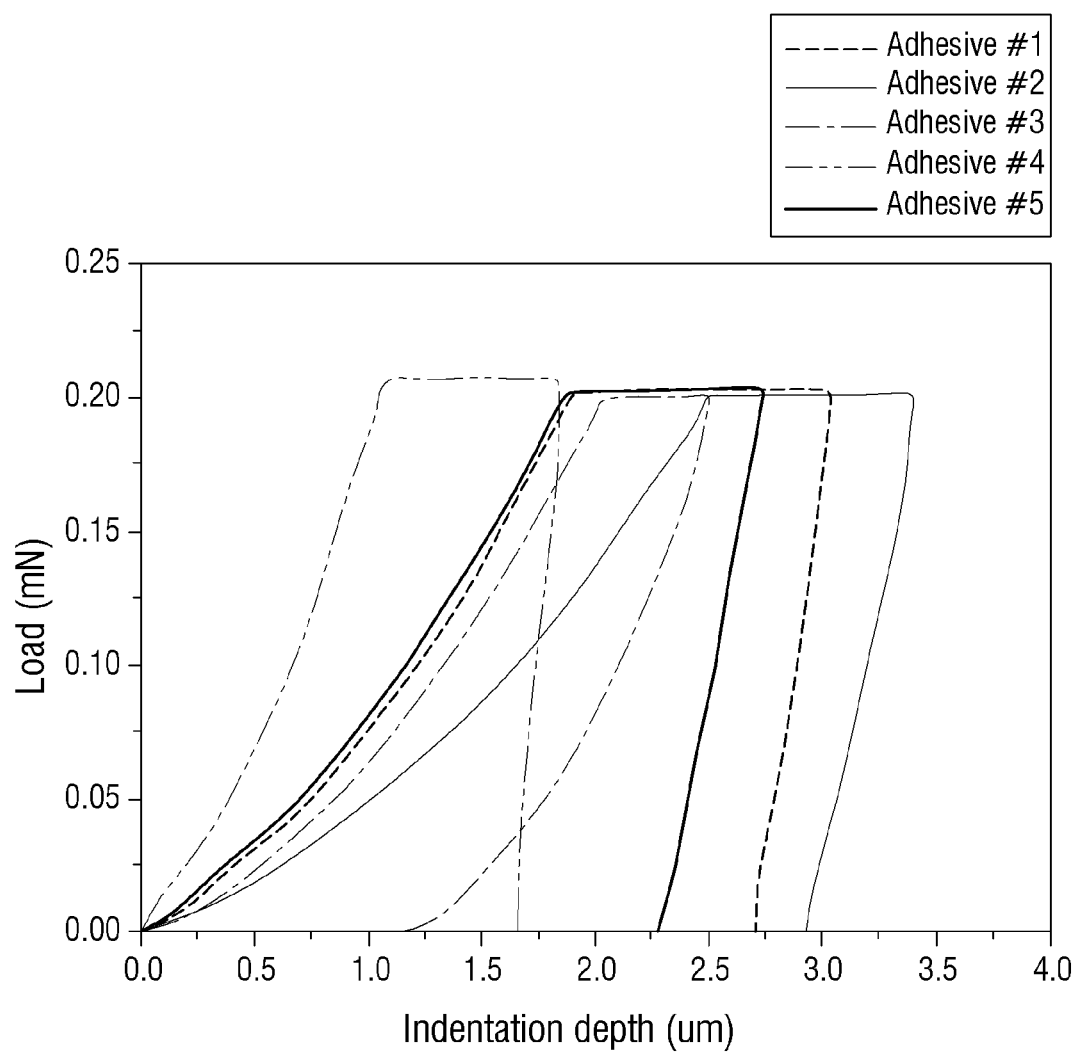
FIG. 15 is a graph showing a relationship between an indentation depth and a load according to experimental examples of adhesive layers.

Referring to FIG. 15 and Table 1, Adhesives #1, #2, #3, #4 and #5 had a modulus of 1 MPa to 10 MPa, and the modulus of Adhesive #4 was the largest. In addition, all the samples exhibited creep characteristics in the range of 20% to 70%, and the creep characteristics of Adhesive #2 and Adhesive #3 were lower than that of the other samples of Adhesive #1, Adhesive #4 and Adhesive #5.

Experimental Example 2: Folding Reliability Test

The in-folding operation was repeatedly performed 200,000 times at 25 degrees Celsius (° C.) for another display device sample among those in Fabrication Example 1. Even when folding was performed 200,000 times, each bonding member of the respective display device exhibited a normal state without causing defective film removal, so that in-folding reliability could be confirmed.

Although embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A display device comprising:
a display panel;
a polarization member facing the display panel;
a cover window including an inorganic material, the cover window facing the display panel with the polarization member therebetween; and
a window bonding member which is between the cover window and the polarization member and attaches the cover window to the polarization member,
wherein the window bonding member which attaches the cover window to the polarization member has a modulus of greater than 1 megapascal to about 10 megapascals.

2. The display device of claim 1, wherein the cover window which is attached to the polarization member by the window bonding member which has the modulus of greater than 1 megapascal to about 10 megapascals, includes glass or quartz, and has a thickness of about 10 micrometers to about 30 micrometers.

3. The display device of claim 2, further comprising:
a cover window protection layer facing the polarization member with the cover window therebetween; and
a protection layer bonding member which is between the cover window protection layer and the cover window and attaches the cover window protection layer to the cover window,
wherein the protection layer bonding member which attaches the cover window protection layer to the cover window has a modulus of about 1 megapascal to about 10 megapascals.

4. The display device of claim 3, wherein
each of the protection layer bonding member and the window bonding member has a thickness,
the thickness of the protection layer bonding member is smaller than the thickness of the window bonding member, and
the modulus of the protection layer bonding member is greater than the modulus of the window bonding member.

5. The display device of claim 4, wherein
each of the window bonding member and the protection layer bonding member has a creep characteristic of about 20% to about 70%, and
the creep characteristic of the window bonding member is smaller than the creep characteristic of the protection layer bonding member.

6. The display device of claim 5, further comprising a polarization bonding member which is between the polarization member and the display panel and attaches the polarization member to the display panel,
wherein
the polarization bonding member which attaches the polarization member to the display panel has both a modulus of about 1 megapascal to about 10 megapascals and a creep characteristic of about 20% to about 70%, and the creep characteristic of the polarization bonding member is smaller than the creep characteristic of the window bonding member.

7. The display device of claim 6, further comprising:
a polymer film layer facing the polarization member with the display panel therebetween; and
a polymer film layer bonding member which is between the polymer film layer and the display panel and attaches the polymer film layer to the display panel,
wherein
the polymer film layer bonding member which attaches the polymer film layer to the display panel has a modulus of about 1 megapascal to about 10 megapascals, and
the modulus of the polymer film layer bonding member is greater than the modulus of each of the protection layer bonding member and the polarization bonding member.

8. The display device of claim 7, wherein
the polymer film layer bonding member which attaches the polymer film layer to the display panel has a creep characteristic of about 20% to about 70%, and
the creep characteristic of the polymer film layer bonding member is greater than the creep characteristic of the window bonding member.

9. The display device of claim 8, further comprising:
a heat dissipation member facing the display panel with the polymer film layer therebetween; and
a heat dissipation portion bonding member which is between the heat dissipation member and the polymer film layer and attaches the heat dissipation member to the polymer film layer,
wherein
each of the polymer film layer bonding member and the heat dissipation portion bonding member has a thickness,
the thickness of the polymer film layer bonding member is smaller than the thickness of the heat dissipation portion bonding member, and
the modulus of the polymer film layer bonding member is greater than the modulus of the heat dissipation portion bonding member.

10. The display device of claim 9, further comprising:
a buffer member which is between the polymer film layer and the heat dissipation member; and
a buffer portion bonding member which is between the buffer member and the polymer film layer and attaches the buffer member to the polymer film layer,
wherein the buffer portion bonding member which attaches the buffer member to the polymer film layer has both a modulus of about 1 megapascal to about 10 megapascals and a creep characteristic of about 20% to about 70%.

11. The display device of claim 5, wherein the thickness of the window bonding member which attaches the cover window to the polarization member, has the creep characteristic of about 20% to about 70% and has the modulus of greater than megapascal to about 10 megapascals, is about 300 micrometers or less.

12. The display device of claim 11, wherein the modulus and the creep characteristic of the window bonding member which attaches the cover window to the polarization member are measured values of indenter-measurement of the window bonding member which has the thickness of about 300 micrometers or less.

13. The display device of claim 12, wherein the modulus and the creep characteristic of the window bonding member are measured values corresponding to a ball-shaped indenter indention depth into the window bonding member which has the thickness of about 300 micrometers or less.

14. The display device of claim 3, wherein the display panel displays an image in a direction toward the cover window.

15. The display device of claim 14, wherein
the display device is in-foldable and includes a display surface at which the image is displayed, and
the display device which is in-folded disposes portions of the display surface facing each other.

16. A display device comprising:
a display panel;
a polarization member facing the display panel;
a cover window including glass or quartz, the cover window facing the display panel with the polarization member therebetween; and
a window bonding member which is between the cover window and the polarization member and attaches the cover window to the polarization member,
wherein the window bonding member which attaches the cover window to the polarization member has both:
a thickness of about 300 micrometers or less, and
a modulus of about 1 megapascal to about 10 megapascals,
wherein the modulus of the window bonding member is a measured value of indenter-measurement of the window bonding member which has the thickness of about 300 micrometers or less.

17. The display device of claim 16, further comprising:
a cover window protection layer facing the polarization member with the cover window therebetween; and
a protection layer bonding member which is between the cover window protection layer and the cover window and attaches the cover window protection layer to the cover window,
wherein
the protection layer bonding member which attaches the cover window protection layer to the cover window has a modulus of about 1 megapascal to about 10 megapascals,
each of the window bonding member and the protection layer bonding member has a creep characteristic of about 20% to about 70%, and
the creep characteristic of the window bonding member is smaller than the creep characteristic of the protection layer bonding member.

18. The display device of claim 17, further comprising a polarization bonding member which is between the polarization member and the display panel and attaches the polarization member to the display panel,
wherein
the polarization bonding member which attaches the polarization member to the display panel has both:
a modulus of about 1 megapascal to about 10 megapascals, and
a creep characteristic of about 20% to about 70%, and
the creep characteristic of the polarization bonding member is smaller than the creep characteristic of the window bonding member.

19. The display device of claim 18, wherein
each of the window bonding member, the protection layer bonding member and the polarization bonding member has a thickness of about 300 micrometers or less, and
the modulus and creep characteristic of the window bonding member, the modulus and creep characteristic of the protection layer bonding member, and the modulus and creep characteristic of the polarization bonding member are measured values of indenter-measurement of a respective bonding member among the window bonding member, the protection layer bonding member and the polarization bonding member which has the thickness of about 300 micrometers or less.

20. The display device of claim 16, wherein the modulus and the creep characteristic of the respective bonding member are measured values corresponding to a ball-shaped indenter indention depth into the respective bonding member which has the thickness of about 300 micrometers or less.

* * * * *